United States Patent [19]
Lwee

[11] Patent Number: 5,282,751
[45] Date of Patent: Feb. 1, 1994

[54] CONNECTOR APPARATUS

[76] Inventor: Nai Hock Lwee, 34196 Finnigan Ter., Fremont, Calif. 94555

[21] Appl. No.: 922,659

[22] Filed: Jul. 31, 1992

[30] Foreign Application Priority Data

Jul. 31, 1991 [JP] Japan .................................. 3-192065

[51] Int. Cl.⁵ .............................................. H05K 1/00
[52] U.S. Cl. ...................................... 439/77; 439/329; 439/78
[58] Field of Search ...................... 439/67, 77, 76, 492, 439/638, 55, 65, 78, 329

[56] References Cited

U.S. PATENT DOCUMENTS

| | | | |
|---|---|---|---|
| 4,545,632 | 10/1985 | Maier et al. | 339/18 R |
| 4,645,280 | 2/1987 | Gordon et al. | 339/17 F |
| 4,684,183 | 8/1987 | Kinoshita et al. | 439/77 |
| 4,781,601 | 11/1988 | Kuhl et al. | 439/77 |
| 4,806,106 | 2/1989 | Mebane et al. | 439/77 |
| 4,861,272 | 8/1989 | Clark | 439/79 |
| 4,895,532 | 1/1990 | Bogese, II | 439/507 |
| 4,948,379 | 8/1990 | Evans | 439/329 |
| 4,950,168 | 8/1990 | Watanabe et al. | 439/34 |
| 4,958,260 | 9/1990 | Kobayashi et al. | 439/77 |

FOREIGN PATENT DOCUMENTS

| | | | |
|---|---|---|---|
| 0112476 | 2/1987 | European Pat. Off. | |
| 2618630 | 1/1989 | France | 439/77 |
| 02-78786 | 11/1990 | Japan | 439/77 |

OTHER PUBLICATIONS

IBM Tech. Disclosure Bulletin "Preparing Molded Circuits" D. A. Radovsky, vol. 4 No. 3, Aug. 1961 pp. 30,31.

Primary Examiner—David L. Pirlot

[57] ABSTRACT

A connector apparatus having a reduced total packaging height despite the presence of mounting receptacle connectors on each the surfaces of a mount board is disclosed. The mount board is formed from a flexible printed circuit bonded to a support plate. The mount board is bent in a stepped or offset relation to an axis extending perpendicular to the surface of the board mount to provide a pair of opposed step sections, lower and upper. A receptacle connector is mounted to the upper and to the lower step section of the mount board; that is, to the side of the board mount having the flexible printed circuit board side and one to the side of the board mount having the support plate. The upper and lower receptacles extend in mutually opposed directions along the axis.

4 Claims, 2 Drawing Sheets

1

CONNECTOR APPARATUS

BACKGROUND OF THE INVENTION

1. Field of the Invention

The present invention relates to a connector apparatus in which a receptacle connector is mounted on both opposed surfaces of a mount board, the connector apparatus being used as an interface board for an electronic apparatus.

2. Description of the Prior Art

There is growing demand for electronic apparatus having a disc drive therein for use in lap top, palm top, and notebook computers. Surface mount technology (SMT) receptacle connectors are used to mount a large number of electronic components on a printed circuit board in high density and to arrange them in a narrow spacing. The receptacle connectors are mounted on both surfaces of an interface board for circuit interconnection through headers to, for example, a plurality of peripheral circuits. Since connectors are mounted on both opposite surfaces of the board, the total packaging height is not reduced, making it difficult to obtain a relatively compact profile for the disc drive.

In view of the foregoing it is believed advantageous to provide a connector apparatus having an SMT receptacle on each surface of a board yet still exhibits a relatively thin, compact height dimension.

SUMMARY OF THE INVENTION

In accordance with the present invention a connector apparatus is provided which reduces the total packaging height despite having an SMT receptacle connector on each surface of a mount board.

The connector apparatus of the present invention comprises: a mount board comprising a support plate and a flexible printed circuit board bonded to the support plate; and a receptacle connector mounted to each surface of the mount board. The mount board is bent in a stepped or offset relation to define upper and lower step sections. The receptacle connectors extend in mutually opposed directions, one from the lower surface of the upper step section and one from the upper surface of the lower step section of the mount board. As a consequence the total height of the connector apparatus of the present invention is relatively compact in height despite having a receptacle connector on surface of the mount board.

The cross-sectional shape of the mount board is board rotation-symmetrical to its center as viewed in the height direction of the receptacle connectors. Guide members are provided integral with the support plate so as to guide the receptacle connector to be mounted thereto and to set it in a predetermined position.

BRIEF DESCRIPTION OF THE DRAWINGS

The invention will be more fully understood from the following detailed description thereof, taken in connection with the accompanying drawings, which form a part of this application and in which.

DETAILED DESCRIPTION OF THE INVENTION

Figure 1:
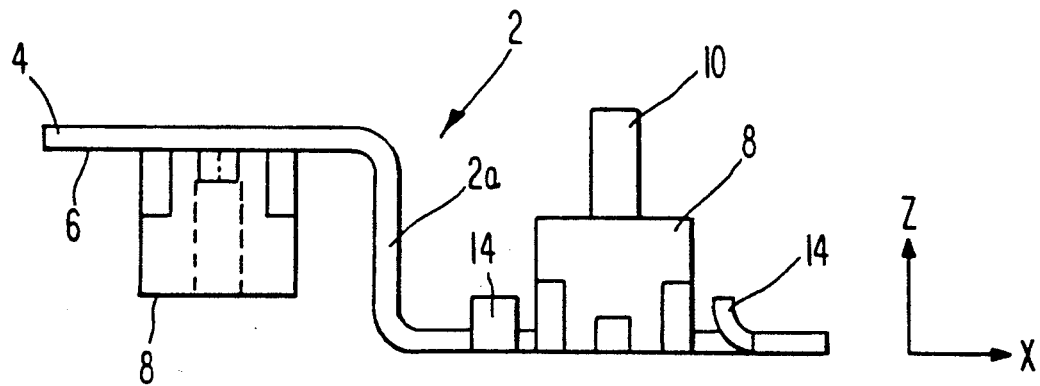
FIG. 1 is a side view showing a connector according to an embodiment of the present invention with a header fitted into a receptacle connector on the surface of the board mount defined by a support plate.

Throughout the following detailed description similar reference numerals refer to similar elements in all Figures of the drawings.

In FIG. 1 a mount board 2 is formed from a support plate, or bracket, 4 having a flexible printed circuit 6 bonded thereto. The support plate 4 made be made from a metal or a non-metal material. The bond is achieved by any heat activatable bonding/holding media. The support plate 4 is bent in a stepped or offset relation to a z-axis direction to provide upper and lower step sections. The flexible printed circuit 6 is sufficiently flexible to conform to the shape of the bent support plate 4. A multi-layer laminated structure may be employed as the flexible printed circuit board 6.

Each one of a pair of SMT (Surface Mount Technology) receptacle connectors 8 is mounted to a surface of the board mount 2. One of the receptacle connectors is mounted to the lower surface of the upper step section of the mount board 2 (i.e., to the side of the board mount 2 having the flexible printed circuit 6 thereon, as shown in FIG. 1). The other receptacle connectors extends in the z-direction from the upper surface of the lower step section. Terminals 8a on the receptacle connectors 8 are connected to a conductive tracings, not shown, on each side of the flexible printed circuit 6. The receptacle connectors 8 are arranged in a side-by-side relation such that both extend in mutually opposite directions from the lower and upper surfaces of the step sections of the board mount. A headers, one of which is shown at reference character 10 in FIG. 1, may from extend each receptacle connector 8.

Figure 2:
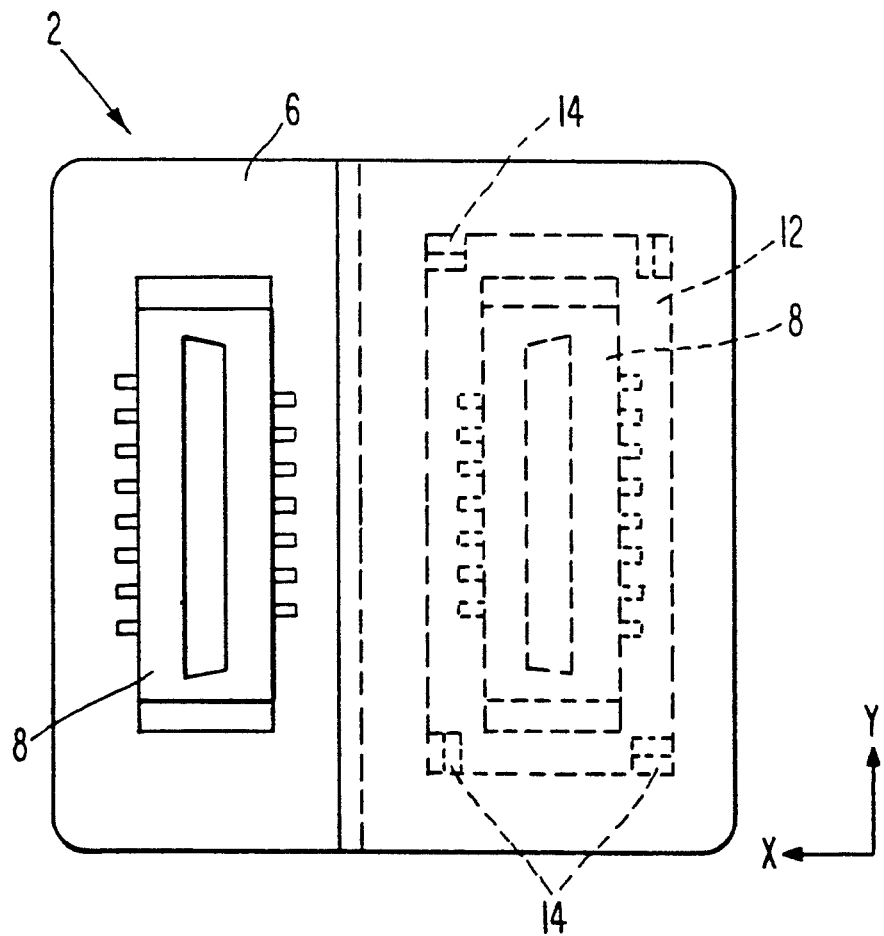
FIG. 2 is a plan view showing the connector of FIG. 1 as viewed from the surface of the board mount defined by a flexible printed circuit board.

As shown in FIGS. 1 and 2, in the present invention, the cross-sectional shape of the mount board 2 is substantially rotation-symmetrical to a center 2a as viewed in the height direction of the cross-section of the receptacle connectors 8. The mount positions of the receptacle connectors are rotation-symmetrical to the center 2a.

Figure 3:
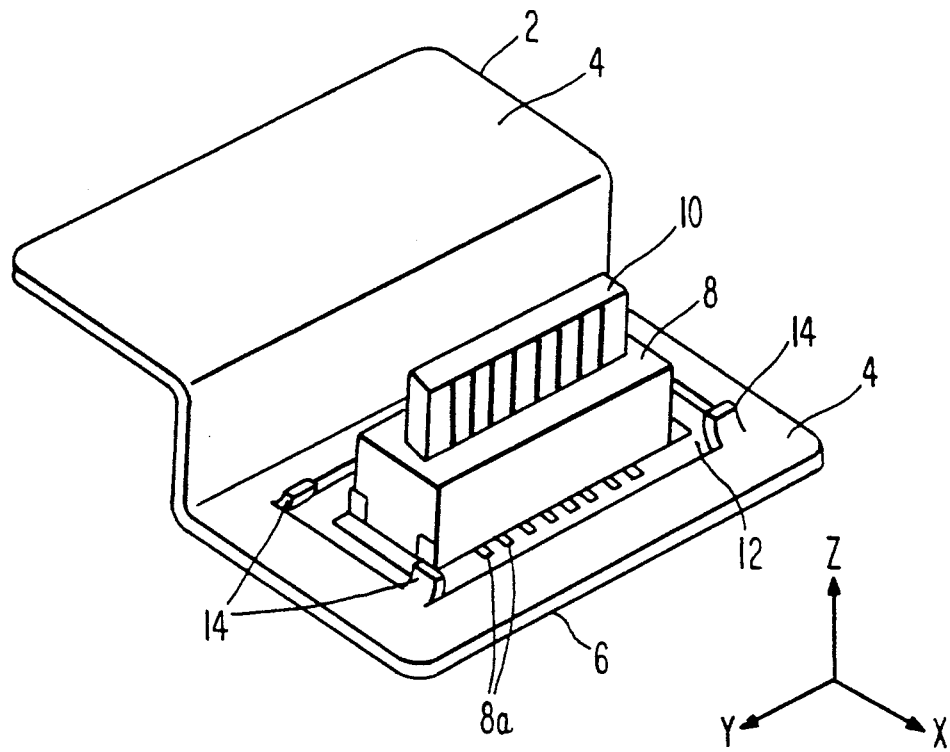
FIG. 3 is a perspective view showing the connector of FIG. 1 as viewed from the surface defined by the support plate.

FIG. 3 shows an arrangement on the surface of the board mount 2 defined by the support plate 4. A mount opening 12 of a rectangular shape enables the receptacle connector 8 on the support plate side of the board mount to make electrical connection to the conductive tracings on the flexible printed circuit 6. Guide projections 14 integral with the support plate 4 may be provided one at each corner of the rectangular opening 12. The guide projections 14 perform a double function, acting as guide members upon the mounting of the receptacle connector and providing additional support sites for firmly setting the receptacle connector 8 by an adhesive to the this surface of board mount.

Figure 4:
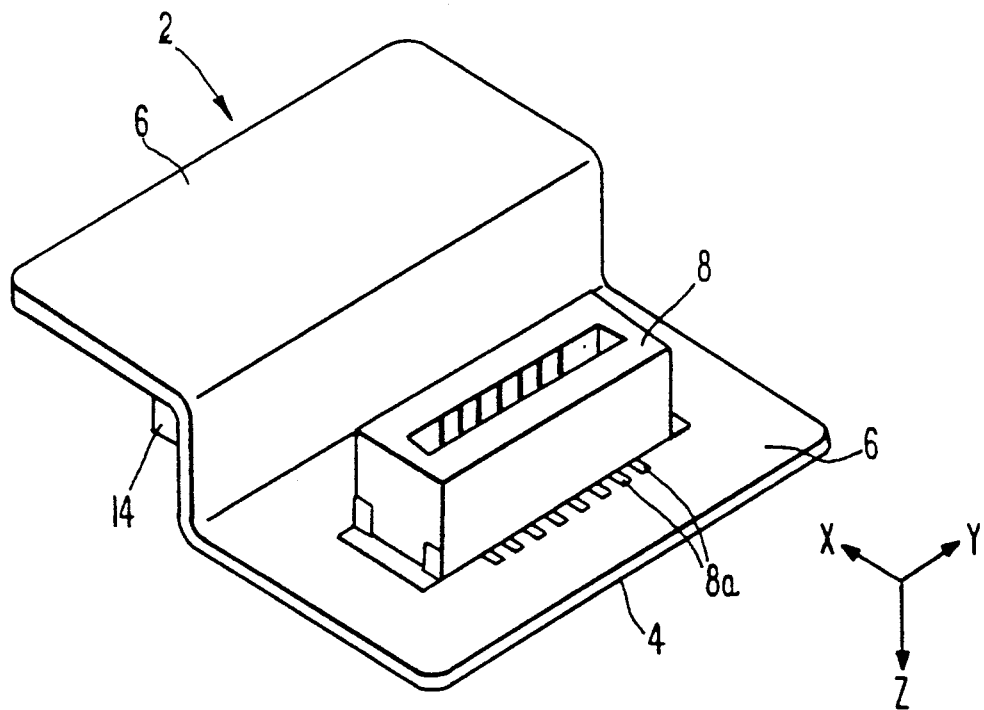
FIG. 4 is a perspective view showing the connector of FIG. 1 as viewed from the surface defined by the flexible printed circuit board.

FIG. 4 shows the arrangement on the surface of the board mount 2 defined by the flexible printed circuit 6. Since, in this case, the receptacle connector 8 is mounted directly to the flexible printed circuit 6, the opening 12 is not needed.

Preferably, the surface of the mount board 2 is coated with adhesive for pre-securing of the component parts of the connector apparatus. Through holes may be provided for further bonding or sealing processes. The coated surface also acts as a seal to prevent epoxy or other bonding media from leaking from the total assembly before its cured state.

When the mount board 2 having its receptacle connectors 8 mounted thereon is employed as an interface for a disc drive, for example, it is possible to design a total drive having a compact minimum packaging height without sacrificing any board space. The disc drive can easily be assembled in a clean room zone using the present invention. The SMT mounting method allows the connector apparatus to be sealed in airtight fashion to present any dust or small particles from entering the disc drive.

It is also possible to achieve a relatively thin, compact portable disc drive as a result of reducing the drive packaging height. It is thus possible to decrease the total packaging size of the lap top, palm top, and notebook computers incorporating a disc drive having a board mount 2 as the interface therein.

The combination, arrangement and number of the receptacle connectors is properly selected to provide the pair of receptacle connectors which are arranged in a rotation-symmetrical relation. Two or more receptacle connectors of identical or different shapes may be arranged in either a rotation-symmetrical or a nonsymmetrical relation.

Those skilled in the art, having benefit of the teachings of the present invention as hereinabove set forth, may impart numerous modifications thereto. Such modifications are to be construed as lying within the scope of the present invention as defined by the appended claims.

What is claimed is:

1. A connector apparatus comprising:
   a mount board comprising a support plate and a flexible printed circuit bonded to the support plate, the support plate and the flexible printed circuit each having a first and a second surface thereon, each surface of the flexible printed circuit having conductive tracings thereon, the first surface of the flexible printed circuit being disposed adjacent to the first surface of the support plate,
   the mount board being bent in a stepped relation to provide upper and lower step sections, an opening extending through the support plate on one of the step sections exposing the first surface of the flexible circuit and the tracings thereon; and
   a receptacle connector connected to each step section of the mount board, each receptacle connector extending in mutually opposed height directions from the respective upper and the lower step sections, one of the receptacle connectors extending through the opening in the support plate and being in electrical connection with the conductive tracings on the first surface of the flexible circuit, the second receptacle connector being in electrical connection to the conductive tracings on the second surface of the flexible printed circuit.

2. The connector apparatus according to claim 1 wherein guide members are provided integral with the support plate to guide the receptacle connector to the support plate and set it in a predetermined position.

3. The connector apparatus according to claim 1 wherein the cross-sectional shape of the mount board is substantially rotation-symmetrical to a center of the mount board in a height direction of the cross-section of the receptacle connectors.

4. The connector apparatus according to claim 3 wherein guide members are provided integral with the support plate to guide the receptacle connector to the support plate and set it in a predetermined position.

* * * * *